United States Patent [19]

Kataoka

[11] 3,973,183
[45] Aug. 3, 1976

[54] METHOD AND APPARATUS FOR DETECTING UNEVEN MAGNETIC FIELD BY A CHANGE IN RESISTANCE OF SEMICONDUCTOR ELEMENT

[75] Inventor: Shoei Kataoka, Tanashi, Japan

[73] Assignee: Agency of Industrial Science & Technology, Tokyo, Japan

[22] Filed: Sept. 9, 1974

[21] Appl. No.: 504,674

Related U.S. Application Data

[62] Division of Ser. No. 281,408, Aug. 17, 1972, Pat. No. 3,835,376.

[52] U.S. Cl............................ 324/46; 340/174 EB
[51] Int. Cl.².......................................... G01R 33/02
[58] Field of Search...................... 324/43 R, 45, 46; 346/174 EB, 174 HA; 307/309; 338/32 R, 32 H

[56] References Cited
UNITED STATES PATENTS

| 3,701,128 | 10/1972 | Copeland | 340/174 EB |
|---|---|---|---|
| 3,716,781 | 2/1973 | Almasi et al. | 324/46 |
| 3,820,089 | 6/1974 | Lama | 338/32 R |

FOREIGN PATENTS OR APPLICATIONS

| 1,020,974 | 2/1966 | United Kingdom | 324/46 |

OTHER PUBLICATIONS

Bobeck, The Magnetic Bubble; Bell Lab Record; vol. 48; July, 1970 pp. 162–169.
Almasi et al. Magnetoresistive Detector for Bubble Domains; Jour. of App. Physics, vol. 42, No. 4, Mar. 1971; pp. 1268–1269.
Kataoka et al., Semiconductor Functional Arrayed Detector Proc. of IEEE, Apr. 1972, vol. 60, No. 4; pp. 460–461.

Primary Examiner—Robert J. Corcoran
Attorney, Agent, or Firm—Kurt Kelman

[57] ABSTRACT

The invention disclosed provides a method and semiconductor device for electrically detecting an inverted magnetic field. A semiconductor magneto-resistive element having two electrodes on opposite ends is disposed in a magnetic field, the magnetic field having at least one inverted magnetic field portion which is applied to one part of the semiconductor element while the normal magnetic field is applied to the other part of the semiconductor element. A current is applied to the two electrodes of the semiconductor element, and measurement of the resistance of the semiconductor device is effected for detecting the inverted magnetic field.

12 Claims, 12 Drawing Figures

METHOD AND APPARATUS FOR DETECTING UNEVEN MAGNETIC FIELD BY A CHANGE IN RESISTANCE OF SEMICONDUCTOR ELEMENT

REFERENCE TO COPENDING APPLICATION

This is a divisional application of my copending application U.S. Ser. No. 281,408, filed Aug. 17, 1972 now U.S. Pat. No. 3,835,376.

BACKGROUND OF THE INVENTION

This invention generally relates to method and apparatus for detecting uneven magnetic field, and more particularly to method and apparatus for electrically detecting the existence of a local inversion of magnetic field such as magnetic bubble domain.

Recently it has been found that a local inversion of magnetic field or magnetic bubble exists in an orthoferrite or garnet element subjected to a bias magnetic field and the art of applying this phenomenon to memory or logic operation has been developed. The conventional method for electrically detecting magnetic bubble domains uses the Hall effect of semiconductor or the magnetic resistive effect of semiconductor or magnetic elements.

As for the prior art of detecting method using the Hall effect of semiconductor, a semiconductor element whose active area is made smaller than the dimensions of the magnetic bubble is conventionally used to detect the magnetic field from the magnetic bubble. In this connection the size of the semiconductor element varies with the size of the magnetic bubble. The semiconductor device to be used for detecting a relatively small magnetic bubble must be accordingly reduced in size, and therefore difficulties arise in producing suitable semiconductor elements. Also, disadvantageously, the detected output signal decreases with the smallness of the element, and accordingly the signal-to-noise ratio decreases. Thus, such small element can not be used for detecting a minute magnetic bubble as small as 5 $\mu$m in garnet.

Conventional four-terminal Hall element makes it actually impossible to build a two-dimensional array to detect magnetic bubbles if any, in two dimensional space owing to the complexity of the wiring.

The main object of this invention is to provide a method for detecting uneven magnetic field in which a magnetic field in a given fixed direction and an inverted magnetic field coexist, by using the newly found galvano-magnetic effects of semi-conductor devices.

Another object of this invention is to provide a method for digitally or analogously detecting magnetic bubbles in the magnetic body which method permits the use of a large semiconductor element compared with the magnetic bubble to be detected.

Another object of this invention is to provide an apparatus for detecting uneven magnetic field which apparatus facilitates the building of a two-dimensional array structure.

Another object of this invention is to provide a method for electrically detecting the position of magnetic bubble domains in the magnetic body without shifting the magnetic bubbles.

Another object of this invention is to provide a method for digitally or analogously and simultaneously detecting the position of a plurality of magnetic bubbles.

Another object of this invention is to provide a system to perform logic operations in the course of detecting magnetic bubble domains.

SUMMARY OF THE INVENTION

To accomplish the objects described above, the method for electrically detecting an inverted magnetic field according to this invention is based on the new idea, in which both the un-inverted and inverted magnetic fields, namely, uneven magnetic field distributions themselves are simultaneously utilized to give pronounced effect on magneto resistive effect in semiconductor. The method comprises the steps of: disposing one part of semiconductor device comprising at least one semiconductor element having two electrodes in an inverted magnetic field portion of a magnetic field and the rest part of the semiconductor device in an un-inverted magnetic field, said two electrodes being opposite ends of said semiconductor element, providing a current to the semiconductor device across two input electrodes, and detecting the change in resistance between said two electrodes of opposite ends of the semiconductor element.

Other objects and features of this invention will be obvious from the following description which is made with reference to the attached drawings in which:

DETAILED DESCRIPTION OF THE INVENTION

Figure 1:
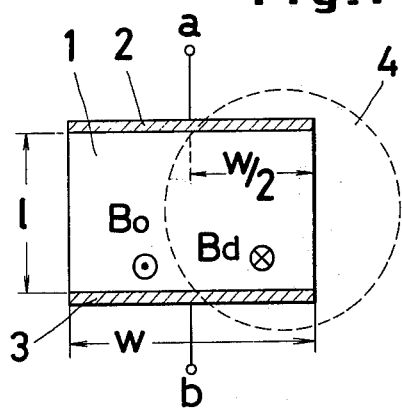
FIG. 1 is an explanatory view showing a method for detecting uneven magnetic field by using a two-terminal semiconductor device according to the present invention.

Referring to FIG. 1, an embodiment of this invention using a two-terminal semiconductor device is shown. A semiconductor element 1 of high mobility is shown as having two electrodes 2, 3 on opposite sides in this figure. This device is put on a magnetic body, and the device is subjected to the magnetic field in the direction perpendicular to the device.

Figure 2:
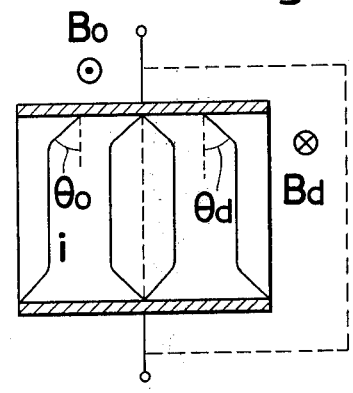
FIG. 2 is an explanatory view which shows the principle of the detecting method shown in FIG. 1.
Figure 3:
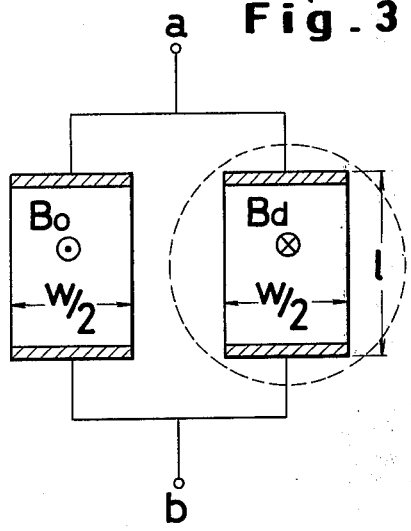
FIG. 3 is an explanatory view showing an arrangement equivalent to the semiconductor device of FIG. 1 when operated.

If an inverted magnetic field $B_d$, for example, due to a magnetic bubble 4 existing in the magnetic body should cut across the electrodes 2, 3, then, the right half of the device is subjected to the inverted magnetic field $B_d$, while the left half of the device is subjected to the un-inverted bias magnetic field $B_o$. The current will flow at opposite Hall angles of inclination $\theta_o$, $\theta_d$ with respect to the electrodes as shown in FIG. 2. This is because the direction of the magnetic field in the left half of the semiconductor body 1 is opposite to the direction of the magnetic field in the right half of the device. Thus, the current will flow in a distributed pattern symmetric with respect to the boundary between the inverted magnetic field and the bias magnetic field. The semiconductor device is equivalent to the parallel-connected two-terminal semiconductor devices as shown in FIG. 3. As is readily understood, the ratio of resistance increase due to magneto resistance effect largely depends upon the ratio of width $w$ of the element to the length $l$ between the electrodes of the element, and is substantially proportional to $w/l$. Therefore, the device of FIG. 1 when partially subjected to an inverted magnetic field $B_d$ will be equivalent to the parallel connection of two half-width devices ($w/2$), and the ratio of resistance increase will become lower, compared with that when the whole device is subjected only to uniform magnetic field $B_o$. When the magnetic bubble in the magnetic body, i.e. the inverted magnetic field $B_d$, is almost as strong as the un-inverted bias magnetic field $B_o$, the increase in resistance will be reduced by half. Therefore, the magnetic bubble can be easily detected by allowing electric current to flow through the device to measure the decrease of resistance in the form of voltage. The actual results are given in the following:

The semiconductor used was n-type InSb; length between the electrodes 60 μm, width 50 μm, thickness 5 μm, and input resistance 60 Ω (no magnetic field). This semiconductor device was used to detect a magnetic bubble as large as 130 μm in diameter appearing in orthoferrite YFeO$_3$ when subjected to a bias magnetic field as strong as 20 oersted. When the magnetic bubble is situated in the same manner as shown in FIG. 1, the resistance decreased by about 0.1 Ω. This decrease was detected in the form of output voltage (about 1 mV) when electric current (about 10 mA) was allowed to flow through the device.

Figure 4:
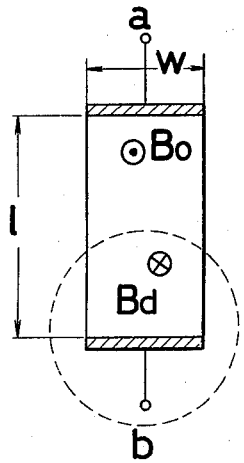
Figure 5:
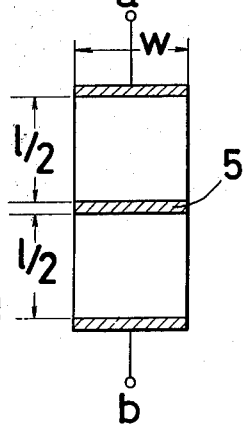
Figure 6:
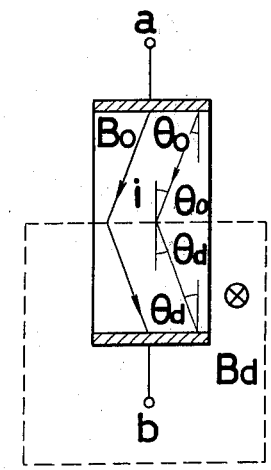

In case that an inverted magnetic field is applied to cut across the free sides (sides having no electrodes) of a semiconductor device having two end electrodes as shown in FIG. 4 the directions of magnetic field are opposite in the upper and lower halves of the semiconductor device, and therefore the Hall angles, the inclination angles of electric current, will be opposite as shown in FIG. 6. This is electrically equivalent to a semiconductor device having a metal boundary 5 at the same position as the boundary of the inverted magnetic field. More specifically, in FIG. 5 an equivalent device is shown as series-connected elements, each element being as long as $l/2$ and as wide as $w$. Accordingly, the ratio of resistance increase will be twice as large as for an element having the dimension of $l$ by $w$. Thus, if the strengths of the magnetic fields $B_o$ and $B_d$ are substantially equal to each other, the ratio of resistance increase of the element will be doubled by the presence of inverted and un-inverted magnetic fields. Therefore, if electric current is passed through the element, this increase of resistance can be detected in the form of an increase in voltage across the electrodes. Thus finally the inverted magnetic field can be detected.

Figure 7:
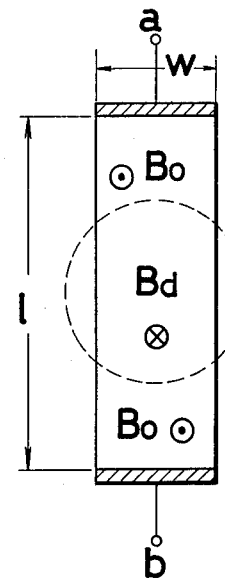
FIGS. 4–8 are explanatory views showing other embodiments for detecting uneven magnetic field by using a two-terminal semiconductor device according to the method of the present invention.
Figure 8:
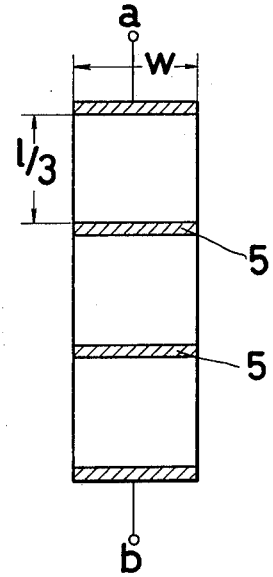

Referring to FIGS. 7 and 8 when an inverted magnetic field $B_d$ is applied to the middle portion of the element and un-inverted magnetic field $B_o$ to the upper and lower portions of the element as shown in FIG. 7, the electrical characteristic of the element shown as if the element has two pseudo-metal boundaries 5 as shown in FIG. 8. In this case the ratio of resistance increase of the element will be approximately tripled. Thus, since the ratio of resistance increase is proportional to the number of boundaries of inverted magnetic fields, the number of magnetic bubbles can be counted with the use of an elongated semiconductor element. Actual experimental results are given below.

A semiconductor body was made of n-type InSb; length between electrodes 60 μm, width 50 μm, and thickness 5 μm. The input resistance of the element was 60 Ω. In the same way as shown in FIGS. 4–6, this element was put on a magnetic bubble in YFeO$_3$ under a bias magnetic field of 20 oe. As a result the resistance of the element increased by about 0.1 Ω, and this increase was detected as a voltage drop as large as about 1 mV at electric current of 10 mA.

Figure 9:
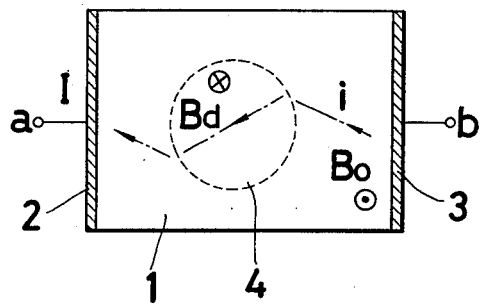
FIGS. 9 and 10 show the principle according to which a variable resistance element detects uneven magnetic field.
Figure 10:
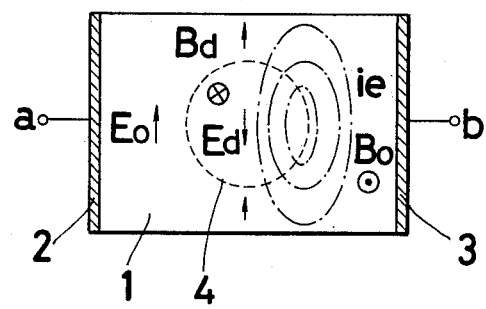

In FIGS. 9 and 10 a semiconductor element 1 of high mobility has electrodes 2 and 3 on opposite ends. The semiconductor is large, compared with the magnetic bubble 4 to be detected, and therefore the magnetic bubble is within the area of the semi-conductor.

As shown in FIG. 9, the bias magnetic field $B_o$ and the magnetic bubble field $B_d$ are opposite in direction.

Under the influence of Hall effect the flow of electric current is changed in direction at the boundary between the magnetic bubble and the bias magnetic field in such a way that the electric current $i$ takes a longer path as indicated by arrows with the result that the resistance of the semiconductor is increased. In absence of magnetic bubble the electric current will be put only under the influence of uniform bias magnetic field $B_o$. Therefore, the deviation of electric current is limited to the neighborhood of the electrodes, causing no appreciable increase in resistance. Accordingly the increase in resistance gives an indication of existence of a magnetic bubble.

The Hall effect appearing in the element can also be used to explain the above phenomenon. If a magnetic bubble 4 is within the element 1 carrying electric current I (FIG. 10), the Hall electric field $E_o$ due to the un-inverted bias magnetic field $B_o$ and the Hall electric field $E_d$ due to the inverted magnetic field from a bubble $B_d$ are opposite in direction. Therefore, eddy currents $i_e$ (chain line) will flow in the element, thus causing electric power loss. This will result in an increase in resistance between electrodes 2 and 3. Thus, an increase in resistance gives an indication of existence of a magnetic bubble 4.

This principle still holds in all cases where there are one and more magnetic bubbles 4 in the element 1. The increased resistance across terminals $a$ and $b$ is proportional to the number or size of the magnetic bubbles 4, thus permitting the analog detection of magnetic bubbles. This is very advantageous in getting out the information which is stored in the analog form of in a magnetic bubbles memory.

Figure 11:
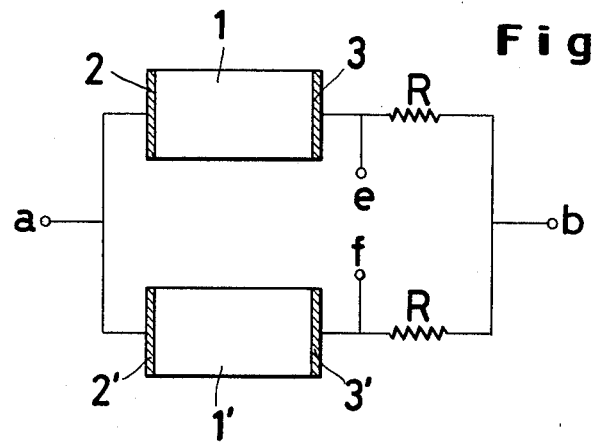
FIG. 11 shows an embodiment using variable resistance elements to perform logic operations according to the method of the present invention.

Referring to FIG. 11, there is shown an embodiment to detect magnetic bubbles at two different positions. This embodiment comprises two elements 1 and 1' parallel-connected via resistors R.

An electric power supply is connected across terminals $a$ and $b$. Only in presence of a magnetic bubble in either element 1, 1' an output voltage will appear across terminals $e$ and $f$, this performing an EXCLUSIVE OR logic operation.

Figure 12:
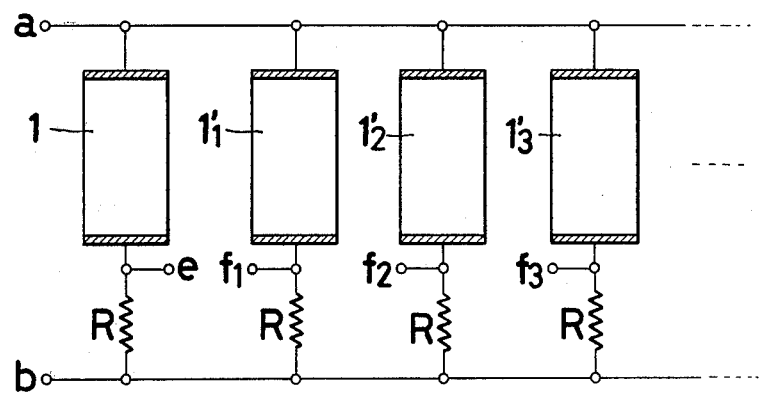
FIG. 12 shows an array pattern of variable resistance elements.

Referring to FIG. 12, a bubble detecting array is shown as being composed of a plurality of elements. Element 1 is positioned at a place where no magnetic bubble will appear whereas the rest of the elements 1'$_1$, 1'$_2$ . . . . are positioned at the places where magnetic bubbles appear. When an element provides an output voltage between its terminal $f$ and terminal $e$, it is known that a magnetic bubble is located at the place of the particular element.

With such array arrangement of the device, it is possible to eliminate spurious output voltage due to a bubble driving source such as an in-plane magnetic field by providing each element with the same bubble driving means.

As seen from the above, according to this invention the semiconductor is subjected to the field of magnetic bubble to cause the resistance of the semiconductor to increase, thus detecting the magnetic bubble. The advantage is to permit the use of relatively large semiconductor elements (and hence a corresponding increase of output signal) and to permit the analog detection of the number or size of magnetic bubbles.

Although the above description is made in terms of magnetic bubbles, it should be noted that the principle of this invention holds in all cases where an inversion of magnetic field exists such as in magnetic strip domain device, domain tip device, magnetic tape and magnetic disk.

As mentioned above, the apparatus for detecting uneven magnetic field according to this invention uses the resultant galvanometric effect on a semiconductor device, the effect being caused by an inverted magnetic field such as magnetic bubble domain applied to a part of the semiconductor device and by an un-inverted magnetic field such as the one originating from a magnetic body free from magnetic bubbles applied to the rest part of the semiconductor device, thus permitting the efficient and reliable detection of uneven magnetic field such as magnetic bubbles. One of the advantages of this invention is to permit the use of a semiconductor body which is larger than the magnetic bubble to be detected so that consequently the output voltage accordingly increases and the signal-to-noise ratio is substantially improved. Another advantage of this invention is that it makes possible the construction of a two-dimensional array comprising numerous semiconductor elements in the simplest possible structural arrangement. It is therefore easy to build a two-dimensional array of a large number of semiconductor elements capable of simultaneously detecting a plurality of magnetic bubbles without shifting the magnetic bubbles or by shifting them only a short distance, thus finally reducing access time to magnetic bubbles. Additionally, in the course of detection various kinds of logic operation of magnetic bubbles can be performed.

What is claimed is:

1. A method for electrically detecting an inverted magnetic field portion in a magnetic field which method comprises: disposing in a magnetic field a semiconductor magneto-resistive element having two input electrodes on opposite ends of the element, said magnetic field having at least one inverted magnetic field portion positioning said magneto-resistive element in the path of said inverted magnetic field so that only one part of said element will be exposed to said inverted field portion in the magnetic field at right angles thereto, passing a current to the semiconductor element across said two electrodes, and measuring a voltage across the semiconductor element.

2. The method of claim 1 wherein the inverted magnetic field portion comprises at least one magnetic bubble.

3. The method of claim 1 wherein the inverted magnetic field portion comprises at least one magnetic strip domain.

4. The method of claim 1 wherein the boundary of the inverted magnetic field portion is applied to intersect the two electrodes on opposite ends of the semiconductor element.

5. The method of claim 1 wherein the boundary of the inverted magnetic field portion is applied to intersect both sides of the semiconductor element.

6. The method of claim 1 wherein the boundary of the inverted magnetic field portion is applied within the area between the two electrodes of the semiconductor element.

7. The method of claim 2 wherein a number of magnetic bubbles whose areas combined are smaller than the semiconductor element are simultaneously applied to the semiconductor element whereby an output proportional to the number of bubbles is obtained from the semiconductor element.

8. A semiconductor device for electrically detecting an inverted magnetic field, said device comprising, in combination, a semiconductor magneto-resistive element having two electrodes on opposite ends and being disposed in a magnetic field, said magnetic field having at least one inverted magnetic field portion, means for providing an inverted magnetic field portion and an un-inverted magnetic field portion in said magnetic field, means for applying said inverted magnetic field portion to one part of said semiconductor element, means for applying said un-inverted magnetic field portion to the other part of said semi-conductor element, a source of current applied to the two electrodes of said semi-conductor element, and means for measuring resistance of said semiconductor device.

9. The semiconductor device of claim 8 wherein the inverted magnetic field portion comprises at least one mmagnetic bubble.

10. The semiconductor device of claim 8 wherein the inverted magnetic field portion comprises at least one magnetic strip domain.

11. The semiconductor device of claim 9 wherein the active length and width of the semiconductor element is larger than the diameter of the magnetic bubble.

12. The semiconductor device of claim 10 wherein the active length and width of the semiconductor element is larger than the width of the magnetic strip domain.

* * * * *